United States Patent [19]

Douglas

[11] Patent Number: 5,460,687
[45] Date of Patent: Oct. 24, 1995

[54] ANISOTROPIC LIQUID PHASE PHOTOCHEMICAL ETCH

[75] Inventor: Monte A. Douglas, Coppell, Tex.

[73] Assignee: Texas Instruments Incorporated, Dallas, Tex.

[21] Appl. No.: 246,388

[22] Filed: May 20, 1994

Related U.S. Application Data

[63] Continuation of Ser. No. 954,131, Sep. 30, 1992.

[51] Int. Cl.$^6$ .................................................. B44C 1/22
[52] U.S. Cl. ........................................... 216/48; 246/94
[58] Field of Search ................................. 156/635, 643, 156/656, 659.1, 666, 901, 902

[56] References Cited

U.S. PATENT DOCUMENTS

| | | | |
|---|---|---|---|
| 3,489,564 | 1/1970 | Schaefer | 156/635 |
| 4,518,456 | 5/1985 | Bjorkholm | 156/626 |
| 4,838,989 | 6/1989 | Ashly et al. | 156/628 |
| 5,201,989 | 4/1993 | Douglas et al. | 156/635 |
| 5,279,702 | 1/1994 | Douglas | 156/635 |

OTHER PUBLICATIONS

ELECTRONICS PACKAGING AND PRODUCTION, vol. 30, No. 8, Aug. 1990, pp. 58–61 Joe Fjelstad "Etching Fine Line Printed Circuit Boards" p. 60, right column.

"Localized Laser Etching of Compound Semiconductors in Aqueous Solutions", Applied Physics Letters, 40(5), Mar. 1, 1982, pp. 391–393, R. M. Gsgood et al.

"The Mechanism of GaAs Etching in $CrO_3$ —HF Solutions," Journal Electrochemistry Society, 132(12), pp. 3026–3033, J. J. Kelly et al.

Toyama, et al., "Crack–Free PZT Thin Films Micropatterned on Silicon Substrate for Integrated Circuits", (abstract) Seiko Instruments Inc.

Watton, et al., "Materials and Technology Research in Uncooled Ferroelectric IR Detector Arrays", Royal Signals and Radar Establishment, U.K., pp. 69–77.

Kauffman, et al., "Studies of Reactions of Atomic and Diatomic Cr, Mn, Fe, Co, Ni, Cu, and Zn with Molecular Water at 15 K", Journal of Physical Chemistry, vol. 89, No. 16, pp. 3541–3547, 1985.

Park, et al., "Reactions and Photochemistry of Atomic and Diatomic Nickel with Water at 15 k", High Temperature Science, pp. 1–15, vol. 25, 1988.

Hauge, et al., "High Isolation Studies of the Reactions of Metal Atoms with Water", Matrix Temperature Science Inc., pp. 338–339, 1981.

Kauffman et al., "Infrared Matric Isolation Studies of the Interactions of Mg, Ca, Sr, and Ba atoms and Small Clusters with Water", High Temperature Science, pp. 97–118, vol. 18, 1984.

Douglas et al, "Matrix Isolation Studies by Electronic Spectroscopy of Group IIIA Metal–Water Photochemistry", J. Chem. Soc., Faraday Trans. 1, pp. 1533–1553, 79, 1983.

Douglas, et al., "Electronic Matrix Isolation Spectroscopic Studies of the Group IIA Metal–Water Photochemistry", High Temperature Science, pp. 201–235, vol. 17, 1984.

Primary Examiner—R. Bruce Breneman
Assistant Examiner—Joni Y. Chang
Attorney, Agent, or Firm—Richard A. Stoltz; Richard L. Donaldson; William E. Hiller

[57] ABSTRACT

An anisotropic liquid phase photochemical etch is performed by submersing a substrate 30 (e.g. copper) in a liquid 34 containing an etchant (e.g. hydrochloric acid) and a passivant (e.g. iodine), the passivant forming an insoluble passivation layer 36 (e.g. CuI) on the surface, preventing the etchant from etching the surface. The passivant and its concentration are chosen such that the passivation layer 36 has a solubility which is substantially increased when it is illuminated with radiation 38 (e.g. visible/ultraviolet light). Portions of the surface are then illuminated with radiation 38, whereby the passivation layer 36 is removed from those illuminated portions of the surface, allowing the etch to proceed there. Portions of the surface not illuminated are not etched, resulting in an anisotropic etch. Preferably, an etch mask 32 is used to create the unilluminated areas. This etch mask 32 may be formed on the surface or it may be interposed between the surface and the radiation source.

13 Claims, 1 Drawing Sheet

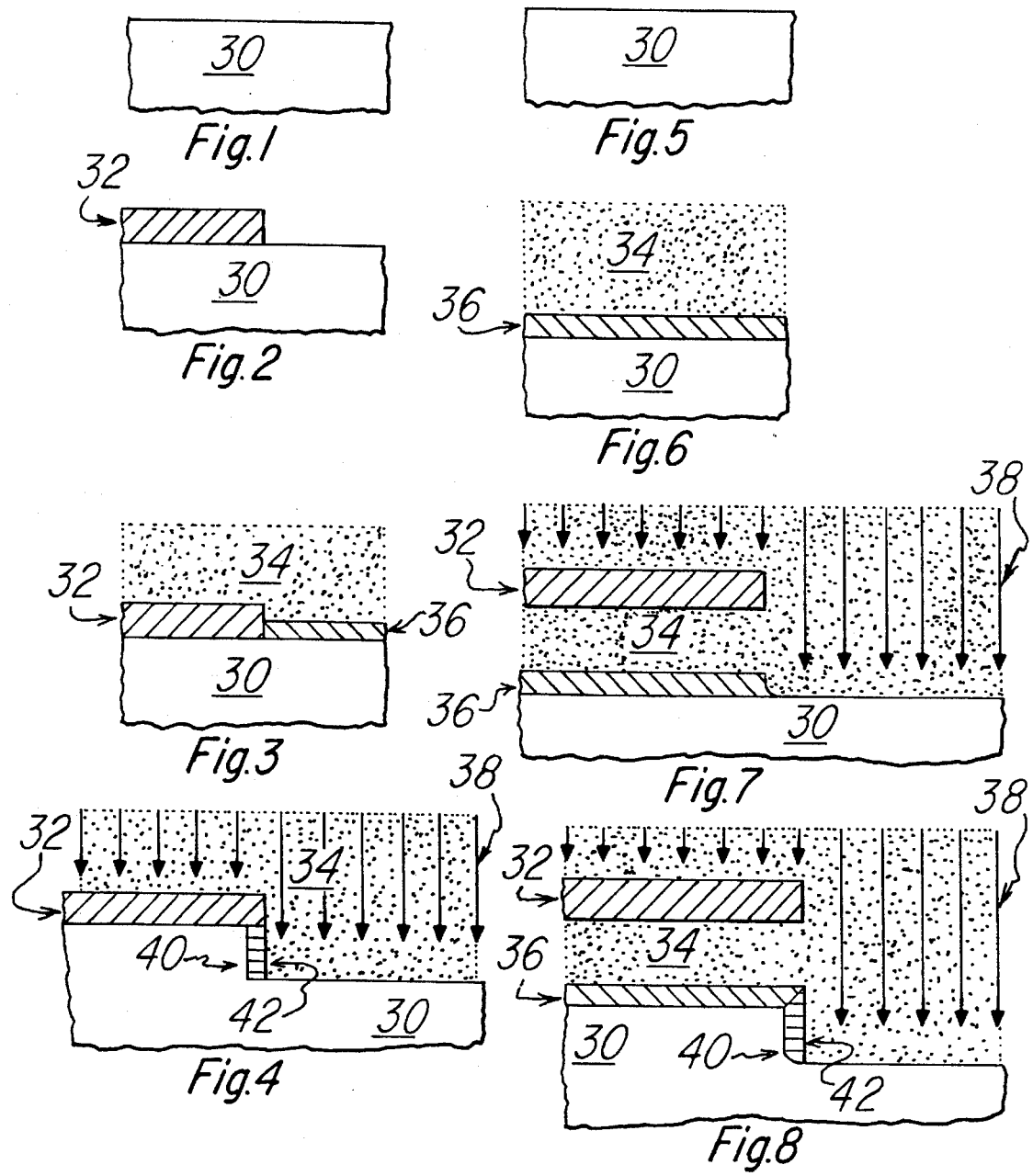

ANISOTROPIC LIQUID PHASE PHOTOCHEMICAL ETCH

This application is a Continuation of application Ser. No. 07/954,131, filed Sep. 30, 1992.

CROSS-REFERENCE TO RELATED APPLICATIONS

The following related applications were filed concurrently with the instant application:

| Title | Inventor | Docket/ Serial # |
|---|---|---|
| Anisotropic Liquid Phase Photochemical Mercury Cadmium Telluride Etch | Douglas | TI-18081 07/954130 |
| Anisotropic Liquid Phase Photochemical Copper Etch | Douglas | TI-16170 07/954087 |

FIELD OF THE INVENTION

This invention generally relates to the fabrication of integrated circuits, and particularly etch process technology.

BACKGROUND OF THE INVENTION

Without limiting the scope of the invention, its background is described in connection with current anisotropic etch techniques.

The fabrication of modern integrated circuits often requires the patterning of materials to very small dimensions and very stringent tolerances. At some stage of virtually any process of manufacturing integrated circuits or discrete devices, many materials including crystalline and non-crystalline semiconductors, insulators and metals must be formed in very precise patterns. A common technique is to deposit a continuous film of the required material, then form an etch mask on the surface of the material (commonly a photoresist layer which has been patterned with a photolithographic technique), and then to etch away the portions of the film not covered by the etch mask, leaving the desired pattern.

Clearly, an etch technique should not etch away material under the etch mask if the pattern defined by the mask is to be preserved in the underlying material. Any etch for this purpose should therefore be largely directional (anisotropic). The desired etch direction is usually normal to the surface of the substrate (i.e. the etch proceeds down into the underlying material but not laterally underneath the mask). An anisotropic etch will ideally leave a virtually vertical sidewall under the etch mask edge.

Plasma etches are among the dry etches which are widely used and are made anisotropic largely by the direction of the applied electric field. Liquid phase chemical etches (wet etches) are generally assumed to be nondirectional (isotropic), and therefore have not found widespread use in the manufacture of VLSI devices. While wet etches are desirable because they are generally low energy techniques which cause little or no damage to substrate materials, unfortunately only a few anisotropic wet etches are known. Crystalline silicon, for example, may be anisotropically etched to some degree with potassium hydroxide. Some chlorine reagents will directionally etch gallium arsenide. These orientation dependent etch (hereafter referred to as ODE) methods are anisotropic because the etch rate along one crystal orientation is faster than that of other directions.

SUMMARY OF THE INVENTION

The few known anisotropic wet etches are not widely applicable to integrated circuit manufacturing for several reasons. First, orientation dependent etches are known for only a few materials used in integrated circuit manufacture. In addition, the direction of an ODE is not necessarily the desired direction (typically normal to the substrate surface). Orientation dependent etches are clearly only anisotropic for crystalline materials. In addition, this type of directional etching results in very sharp corners between the facets defined by the different crystalline orientations. The sharp corners can cause extremely high electric fields and/or dislocations during oxidation, for example, which make these etches unacceptable for state-of-the-art semiconductor processing.

Plasma etches are often not suitable because they are generally high energy techniques. For example, the high electric fields, temperatures and kinetic energies associated with these etches can cause unacceptable material damage and device performance degradation.

Current etch techniques present a tradeoff between high energy anisotropic etches (e.g. plasma etching) and low energy isotropic wet etches. The present invention overcomes this tradeoff by providing an anisotropic liquid phase etch which is generally applicable to a wide variety of materials (single crystal, poly-crystalline and non-crystalline), is low energy, and which is easily integrated into current processes for integrated circuit manufacture.

Generally, and in one form of invention, an anisotropic liquid phase photochemical etch is performed by submersing a surface in a liquid etchant, then adding a passivant to the liquid etchant which forms an insoluble passivation layer on the surface, preventing the etchant from relatively rapidly etching the surface. The passivant and its concentration are chosen such that the passivation layer has a solubility which is substantially increased when it is illuminated with radiation (e.g. visible light). Portions of the surface are then illuminated, whereby the passivation layer is removed from those illuminated portions of the surface, allowing the etch to proceed there. Portions of the surface not illuminated are substantially not etched, resulting in an anisotropic etch. Preferably, an etch mask is used to create the unilluminated areas. This etch mask may be formed on the surface or it may be interposed between the surface and the radiation source.

This is apparently the first method to allow anisotropic liquid phase etching which is independent of the crystalline structure of the substrate. The advantages of this method are many. It allows anisotropic etching of amorphous, polycrystalline and single crystal materials. The etch direction may be made normal to the substrate surface regardless the crystal orientation (if any) of the substrate. It can be used on all single crystal materials whereas known ODE techniques are limited to only a few materials. It does not generate the sharp corners characteristic of ODE that cause high field and dislocation problems. Compared to dry etching, it is virtually a damage-free process, which is a growing need for current and next generation semiconductor devices. In addition, the process offers a capability to directionally etch a much broader spectrum of materials compared to dry etching which depends, primarily, on the volatility of halogen compounds.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings:

FIGS. 1–4 are microscopic cross sections of a substrate undergoing liquid phase photochemical etching which depict the function of etch passivation when the etch mask is in contact with the substrate.

FIGS. 5–8 are microscopic cross sections of a substrate undergoing liquid phase photochemical etching which depict the function of etch passivation when the etch mask is displaced from the substrate.

DETAILED DESCRIPTION OF THE PREFERRED EMBODIMENTS

A first preferred embodiment of this invention is described with reference to FIGS. 1, 2, 3 and 4, which illustrate anisotropic liquid phase etching where the etch mask is in contact with the substrate to be etched. FIG. 1 shows a greatly magnified cross section of a substrate 30. FIG. 2 shows the surface of the substrate partially covered with an etch mask 32. This etch mask may be formed of photoresist by standard photolithographic techniques, or may be any material which is etch resistant (and preferably opaque to the illuminating radiation) and which adheres to the surface. FIG. 3 depicts the substrate and etch mask immersed in a liquid 34. The liquid contains one or more etchants and one or more passivants. A passivant is chosen such that it causes the formation of a thin insoluble passivation layer 36 to form on the exposed surface of the substrate. This layer is typically extremely thin (possibly a monolayer); its thickness is greatly exaggerated in the figures for clarity. This insoluble layer prevents the etchant from etching the substrate. Upon illumination with radiation 38, as depicted in FIG. 4, the passivation layer 36 is removed from the substrate 30 and etching proceeds in areas which are illuminated. A substantially vertical sidewall 40 forms, which is protected from etching by the vertical passivation layer 42. This vertical passivation layer 42 is not removed from the sidewall 40 because it is in the shadow of the etch mask 32.

A second preferred embodiment of this invention is described with reference to FIGS. 5, 6, 7 and 8 which illustrate anisotropic liquid phase etching where the etch mask is displaced from the substrate to be etched. FIG. 5 shows a greatly magnified cross section of a substrate 30. FIG. 6 shows the surface of the substrate immersed in a liquid 34. Again, the liquid contains one or more etchants and one or more passivants. A passivant is chosen so that it causes the formation of a thin insoluble passivation layer 36. This layer is again typically extremely thin (possibly a monolayer) with its thickness greatly exaggerated in the figures for clarity. This insoluble layer substantially prevents the etchant(s) from etching the substrate. As shown in FIG. 7, an etch mask 32 is positioned above the substrate 30 so that it blocks the radiation 38 at selected portions of the substrate. This etch mask may be any material which is sufficiently opaque to the illuminating radiation, and is not necessarily positioned within the liquid. Upon illumination with radiation, as depicted in FIG. 8, the insoluble passivation layer 36 is removed from the substrate 30 in those areas where the radiation is not blocked by the etch mask 32. With the passivation layer removed, etching of the substrate proceeds in those illuminated areas. Again, a substantially vertical sidewall 40 forms, which is protected from etching by the vertical passivation layer 42. This vertical passivation layer 42 is not removed from the sidewall 40 because it is in the shadow of the etch mask 32.

In both preferred embodiments, an etchant is chosen which will etch the substrate (in the absence of a passivation layer) with or without the presence of the illuminating radiation. The passivant is chosen to form a layer on the substrate surface which is removed or partially removed by radiation. Although the mechanism or explanation for this removal is uncertain, it is thought that the passivant bonds to the surface under no illumination, but is detached from the surface and re-enters solution when illuminated.

An important aspect of this invention is the automatic passivation of sidewalls as they are formed. As depicted in the figures, sidewalls are created when illuminated areas are removed by etching. The sidewalls are etched only to the point where they are in the shadow of the etch mask. The passivation layer then remains on the vertical surface and the sidewall is protected from further etching. Very high etch anisotropy is achieved.

It should be noted that the etch rate of some liquid etches may be accelerated by illuminating radiation, thereby exhibiting some anisotropy without passivation. The technique set forth in the instant preferred embodiments may be used with these photochemical wet etches to further enhance their anisotropy (i.e. increase the ratio of illuminated etch rate to unilluminated etch rate). Passivation of the wall occurs as the etching proceeds.

The conditions of the etch process may be changed to affect, for example, the illuminated etch rate and the illuminated/unilluminated etch rate ratio. The temperature of the liquid may be changed. The concentration of both the etchant and passivant may of course be varied. The liquid may be made to flow with respect to the substrate. The intensity and wavelength of the radiation may be varied. The illuminating radiation need not be constant in time, i.e. the radiation source may be pulsed.

In an experiment to demonstrate this technique, copper was anisotropically etched in a liquid containing 0.1% molar concentration hydrochloric acid (the etchant) and 0.019% molar iodine (the passivant). A layer of copper was deposited on a crystalline silicon substrate, and a photoresist etch mask was then formed on the copper. The illuminating radiation was provided by a 200 Watt mercury/xenon lamp, which produces visible/ultraviolet radiation. When the lamp was switched on, the etch proceeded in those areas not covered by photoresist until no copper remained. Essentially no undercut of the photoresist occurred. The same experiment performed with no iodine present in the liquid resulted in severe undercut of the etch mask.

In another example of this technique, mercury cadmium telluride (hereafter referred to as MCT) was anisotropically etched in a liquid containing 0.1% molar concentration hydrochloric acid (the etchant) and 0.1% molar concentration iodic acid (the passivant). The illuminating radiation was again provided by a 200 Watt mercury/xenon lamp. Anisotropic etching of the MCT was achieved.

The sole Table, below, provides an overview of some embodiments and the drawings.

TABLE

| Figure Element | General Term | Specific or Preferred Term | Alternate Terms / Function |
|---|---|---|---|
| 30 | Substrate | Copper | |
| 32 | Etch Mask | Photoresist | Blocks radiation |
| 34 | Liquid | 0.1% molar HCl and 0.019% molar $I_2$ | Contains etchant and passivant |
| | Etchant | 0.1% molar HCl | Etches substrate with or without presence of illuminating radiation in absence of passivation layer. |
| | Passivant | 0.019% molar $I_2$ | Reacts with substrate to form passivation layer. |
| 36 | Passivation layer | CuI, $CuI_2$ | Product of passivant and substrate; removed from surface by radiation. |
| 38 | Radiation | Visible/UV light from 200 Watt mercury/xenon lamp | Removes or partially removes passivation layer from surface |
| 40 | Sidewall | | Forms as etch proceeds in illuminated areas |
| 42 | Sidewall passivation layer | CuI, $CuI_2$ | Forms on sidewall under edge of etch mask as etch proceeds; remains because sidewall is in shadow |

A few preferred embodiments have been described in detail hereinabove. It is to be understood that the scope of the invention also comprehends embodiments different from those described, yet within the scope of the claims. Various modifications and combinations of the illustrative embodiments, as well as other embodiments of the invention, will be apparent to persons skilled in the art upon reference to the description. The "substrate" may consist, for example, of partially fabricated electronic circuitry. The liquid may be acidic, neutral or basic. Salt solutions are contemplated, as well as solutions containing organic solvents. Pure water may be used as an etchant. Use of this technique is contemplated for the manufacture of discrete components or fully integrated circuits in silicon, gallium arsenide, or other electronic materials families, as well as in optical-based or other technology-based forms and embodiments. It is therefore intended that the appended claims encompass any such modifications or embodiments.

What is claimed is:

1. An anisotropic etch method comprising:
   (a) supplying a substrate having an etch mask in contact with a surface of said substrate, said surface having one or more exposed areas not covered by said etch mask;
   (b) submersing said substrate in a liquid, said liquid including at least one etchant and one passivant, said etchant capable of etching said surface, said passivant forming a passivation layer on said surface, said passivation layer being substantially insoluble in said liquid; and
   (c) illuminating said substrate with radiation to produce illuminated areas and unilluminated areas on said substrate, said radiation removing said passivation layer from said illuminated areas, causing said illuminated areas to be etched while said unilluminated areas remain substantially unetched;
   whereby an anisotropic etch of said surface in said exposed areas is achieved.

2. The method according to claim 1, wherein said passivant is added to said liquid before said submersing step.

3. The method according to claim 1, wherein said etch is accelerated by said radiation.

4. The method according to claim 1, wherein said liquid flows with respect to said substrate.

5. The method of claim 1, wherein the intensity of said radiation varies in time.

6. The method of claim 1, wherein the intensity of said radiation varies across said surface.

7. The method of claim 1, wherein said liquid is maintained at approximately 25 C. during said etch.

8. The method of claim 1, wherein said radiation is monochromatic.

9. The method of claim 1, wherein said liquid contains two or more passivants.

10. The method of claim 1, wherein said liquid contains two or more etchants.

11. The method of claim 1, wherein said liquid comprises $H_2O$ and at least one passivant.

12. The method of claim 1, wherein said etch mask is formed of patterned photoresist.

13. An anisotropic etch method comprising:
   (a) supplying a substrate having an etch mask in contact with a surface said substrate, said surface having one or more exposed areas not covered by said etch mask;
   (b) submersing said substrate in an aqueous solution, said aqueous solution including at least one passivant, said aqueous solution capable of etching said surface, said passivant forming a passivation layer on said surface, said passivation layer being substantially insoluble in said aqueous solution; and
   (c) illuminating said substrate with radiation to produce illuminated areas and unilluminated areas on said substrate, said radiation removing said passivation layer from said illuminated areas, causing said illuminated areas to be etched while said unilluminated areas remain substantially unetched;
   whereby an anisotropic etch of said surface in said exposed areas is achieved.

* * * * *